(12) United States Patent
Zhu et al.

(10) Patent No.: US 7,853,910 B1
(45) Date of Patent: Dec. 14, 2010

(54) PARASITIC EFFECTS ANALYSIS OF CIRCUIT STRUCTURES

(75) Inventors: Zhenhai Zhu, Alameda, CA (US); Joel Phillips, Oakland, CA (US); Zuo-Chang Ye, Albany, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 432 days.

(21) Appl. No.: 11/963,523

(22) Filed: Dec. 21, 2007

(51) Int. Cl.
G06F 17/50 (2006.01)
(52) U.S. Cl. ............................................. 716/5; 703/16
(58) Field of Classification Search ................... 716/5; 703/16
See application file for complete search history.

(56) References Cited

U.S. PATENT DOCUMENTS

| | | | | | |
|---|---|---|---|---|---|
| 6,128,768 | A | * | 10/2000 | Ho | 716/5 |
| 6,421,814 | B1 | * | 7/2002 | Ho | 716/5 |
| 6,539,524 | B1 | * | 3/2003 | Walden | 716/5 |
| 6,877,148 | B1 | * | 4/2005 | Hassibi et al. | 716/13 |
| 7,451,412 | B2 | * | 11/2008 | Jones et al. | 716/4 |
| 2003/0154457 | A1 | * | 8/2003 | Armbruster | 716/10 |
| 2007/0033561 | A1 | * | 2/2007 | Jones et al. | 716/6 |
| 2008/0133202 | A1 | * | 6/2008 | Tseng et al. | 703/14 |
| 2008/0265361 | A1 | * | 10/2008 | Krauss | 257/503 |
| 2009/0033398 | A1 | * | 2/2009 | Dennis et al. | 327/293 |

OTHER PUBLICATIONS

Nabors, Keith, et al., , "Fast Capacitance Extraction of General Three-Dimensional Structures," IEEE Trans. on Microwave Theory and Techniques, Jul. 1992, vol. 40, No. 7, p. 1496-1507.
Shi, Weiping, et al., "A Fast Hierarchical Algorithm for 3-D Capacitance Extraction", IEEE Transactions on Computer-Aided Design of Integraeted Circuits and Systems, vol. 21, No. 3, Mar. 2002, pp. 330-336.
Kapur, Sharad, et al., "Large-Scale Full-Wave Simulation", Proceedings of the 41st Design Automation Conference, 2004, pp. 806-809.
Parks, Michael L., et al., "Recycling Krylov Subspaces for Sequences of Linear Systems", SIAM Journal on Scientific Computing, vol. 28, No. 5, pp. 1651-1674, 2006.
Telichevesky, Ricardo, et al., "Efficient AC and Noise Analysis of Two-tone RF Circuits," Proceedings of the 33rd Design Automation Conference, Jun. 2006, pp. 292-297.

* cited by examiner

Primary Examiner—Phallaka Kik
(74) Attorney, Agent, or Firm—Sawyer Law Group, P.C.

(57) ABSTRACT

Method, system, and computer program product for analyzing circuit structures for parasitic effects are provided. Data from a previous parasitic effect analysis of a circuit structure is used to perform parasitic effect analysis on another circuit structure even when the circuit structures are not identical, provided the circuit structures are similar.

20 Claims, 11 Drawing Sheets

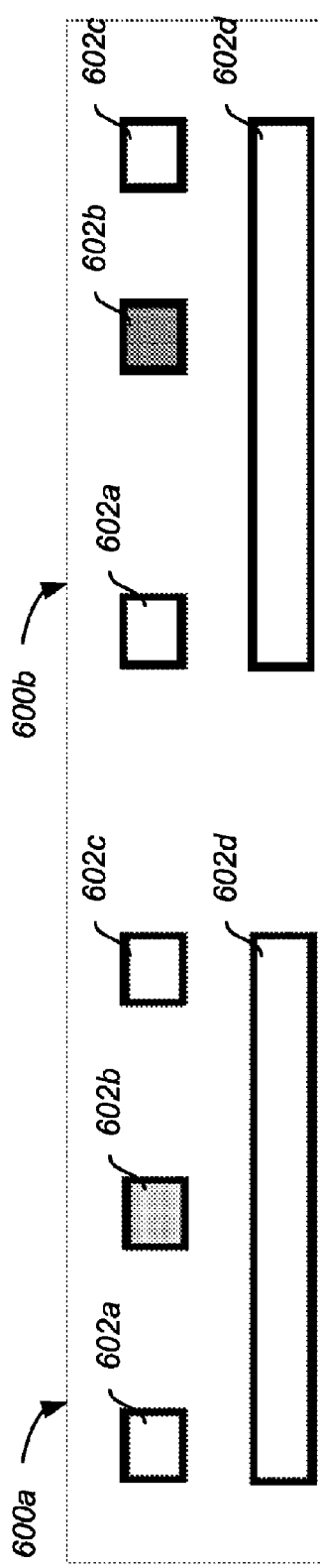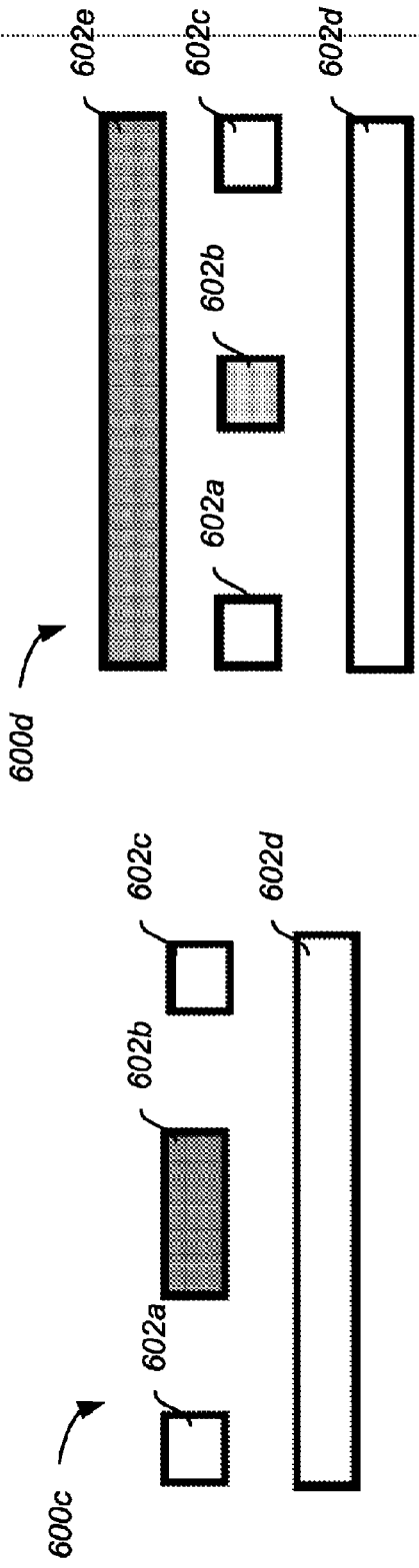

COST COMPARISON FOR DIFFERENT METHOD.

| Method | projection | iteration |
|---|---|---|
| GMRES | – | $(k+m')m'N$ |
| KR GMRES | $(k'q+q^2)N$ | $(k+2q+m)mN$ |
| MKR GMRES | $k'qN + 3/2q^2 N_{pl}$ | $(k+2q+m)mN$ |

TOP 5 PATTERNS WITH MOST NON-ZEROS FOR BUS 10×10.

| pattern | rep. times |
|---|---|
|  | 80 |
|  | 80 |
|  | 116 |
|  | 144 |
|  | 40 |

FIG. 11

PARASITIC EFFECTS ANALYSIS OF CIRCUIT STRUCTURES

FIELD OF THE INVENTION

The present invention relates generally to analyzing circuit structures for parasitic effects.

BACKGROUND OF THE INVENTION

Performing electromagnetic effects analysis on circuit structures typically involves calculating field solutions to Maxwell's equations, which govern electromagnetic behavior. Currently, when different circuit structures are to be analyzed, each circuit structure is analyzed from scratch (e.g., full field solutions are calculated), even if one circuit structure is structurally similar to another circuit structure (e.g., the one circuit structure is a sub-structure the other circuit structure) that has already been analyzed. Thus, electromagnetic effects analysis becomes more inefficient, costly, time consuming, and so forth as the number of circuit structures to be analyzed increases.

SUMMARY OF THE INVENTION

Method, system, and computer program product for analyzing circuit structures for parasitic effects are provided. The method provides for receiving a first circuit structure for analysis of a parasitic effect, comparing the first circuit structure to a second circuit structure not identical to the first circuit structure to determine whether the second circuit structure is similar to the first circuit structure, and analyzing the first circuit structure for the parasitic effect using data from a previous analysis of the second circuit structure for the parasitic effect when the second circuit structure is similar to the first circuit structure.

BRIEF DESCRIPTION OF THE DRAWINGS

FIGS. 6A-6D illustrate sample geometric and topological transformations of a circuit structure.

FIG. 11 shows a table showing statistics of repetitive patterns in the sample bus structure of FIG. 10.

DETAILED DESCRIPTION

The present invention generally relates to analyzing circuit structures for parasitic effects. The following description is presented to enable one of ordinary skill in the art to make and use the invention and is provided in the context of a patent application and its requirements. The present invention is not intended to be limited to the implementations shown, but is to be accorded the widest scope consistent with the principles and features described herein.

Analysis of electromagnetic effects (e.g., resistance, capacitance, inductance, and so forth) in circuit structures typically starts with calculating field solutions to Maxwell's equations or some approximation of Maxwell's equations for a circuit structure. Maxwell's equations are a set of equations that describe the interrelationships between, for instance, electric fields, magnetic fields, electric charge, electric current, and so forth.

Current electromagnetic effects analysis approaches focus on efficiently analyzing a single circuit structure with fixed topology (e.g., layout, pattern, placement, or the like) and geometry (spacing, sizing, or the like). However, there is often a desire to vary the topology and/or geometry of a circuit structure and analyze the variations to determine how electromagnetic effects change as topological and/or geometrical changes are made.

With current electromagnetic effects analysis approaches, each variation will usually be analyzed as a separate circuit structure from scratch (e.g., a full field solution will be calculated), even when data from the analysis of other similar variations is available. Hence, as the number of variations/circuit structures increases, electromagnetic effects analysis becomes more inefficient, costly, time consuming, and so forth.

The problems associated with electromagnetic effects analysis also apply to other types of analysis, such as stress analysis, thermal analysis, diffraction analysis, simulation analysis, or the like. As used herein, the term "parasitic effect" analysis will used to refer to any one of the different types of analysis listed above and any other type of analysis that involves solving system of equations.

Figure 1:
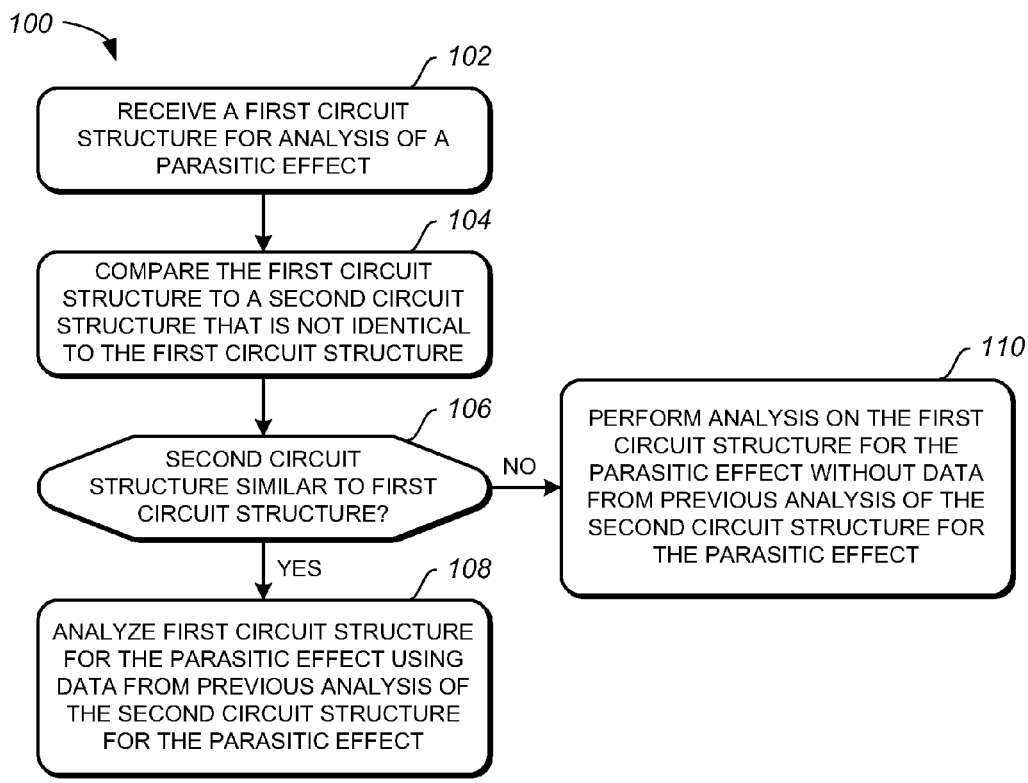
FIG. 1 depicts a process for analyzing circuit structures for parasitic effects according to an implementation of the invention.

Depicted in FIG. 1 is a process 100 for analyzing circuit structures for parasitic effects according to an implementation of the invention. At 102, a first circuit structure is received for analysis of a parasitic effect. The first circuit structure may be at a lower circuit structure level (e.g., wiring level) or may be at a higher circuit structure level (e.g., package level). In one implementation, the parasitic effect for which the first circuit structure is being analyzed is one of stress, thermal, simulation, diffraction, and electromagnetic effect.

At 104, the first circuit structure is compared to a second circuit structure that is not identical to the first circuit structure. The second circuit structure was previously analyzed for the parasitic effect. A determination is made at 106 as to whether the second circuit structure is similar to the first circuit structure based on the comparison of the two circuit structures. In one implementation, the second circuit structure is similar to the first circuit structure when one of the first circuit structure and the second circuit structure is a sub-structure of the other (e.g., the first circuit structure is a sub-structure of the second circuit structure or the second circuit structure is a sub-structure of the first circuit structure).

The second circuit structure may also be similar to the first circuit structure when, for instance, at least a portion of the first circuit structure and at least a portion of the second circuit structure are topologically the same (e.g., same layout and so forth), but geometrically different (e.g., different spacing, sizing, and so forth), the first circuit structure and the second circuit structure share a sub-structure (e.g., a sub-structure of the first circuit structure is identical to a sub-structure of the second circuit structure), or the like.

If it is determined that the second circuit structure is similar to the first circuit structure, the first circuit structure is analyzed for the parasitic effect using data from the previous analysis of the second circuit structure for the parasitic effect at 108. For example, a vector (e.g., a Krylov vector, a solution vector, an Eigen vector, a principal component vector, or the like) generated, a matrix assembled, and/or a matrix vector product computed during the previous analysis of the second circuit structure for the parasitic effect may be used to analyze the first circuit structure for the parasitic effect. Hence, a full field solution may not have to be calculated in order to analyze the first circuit structure for the parasitic effect.

On the other hand, if it is determined that the second circuit structure is not similar to the first circuit structure, then analysis of the first circuit structure for the parasitic effect is performed at 110 without data from the previous analysis of the second circuit structure for the parasitic effect. Thus, a full field solution will need to be calculated in order to analyze the first circuit structure for the parasitic effect.

Although in the implementation of FIG. 1, the second circuit structure was previously analyzed for the same parasitic effect that the first circuit structure is currently being analyzed for, it is not necessary that the parasitic effect previously analyzed be the same as the parasitic effect currently being analyzed in order for data to be reused. For example, the parasitic effect previously analyzed may be a thermal effect, while the parasitic effect currently being analyzed is a stress effect. To give another example, even if the parasitic effect previously analyzed and the parasitic effect currently being analyzed are both electromagnetic effects, one may involve capacitance, while the other may involve inductance.

As seen from above, analysis of a circuit structure for a parasitic effect can be expedited, overhead associated with the analysis can be reduced, and efficiency of the analysis can be improved by using data from previous parasitic effect analysis on one or more other circuit structures that are similar to the circuit structure currently being analyzed. Improvements in analysis may depend on the degree of similarity between the circuit structure currently being analyzed and the one or more other circuit structures previously analyzed. Accuracy of analysis, however, will not be affected by the degree of similarity between the circuit structures.

Figure 2:
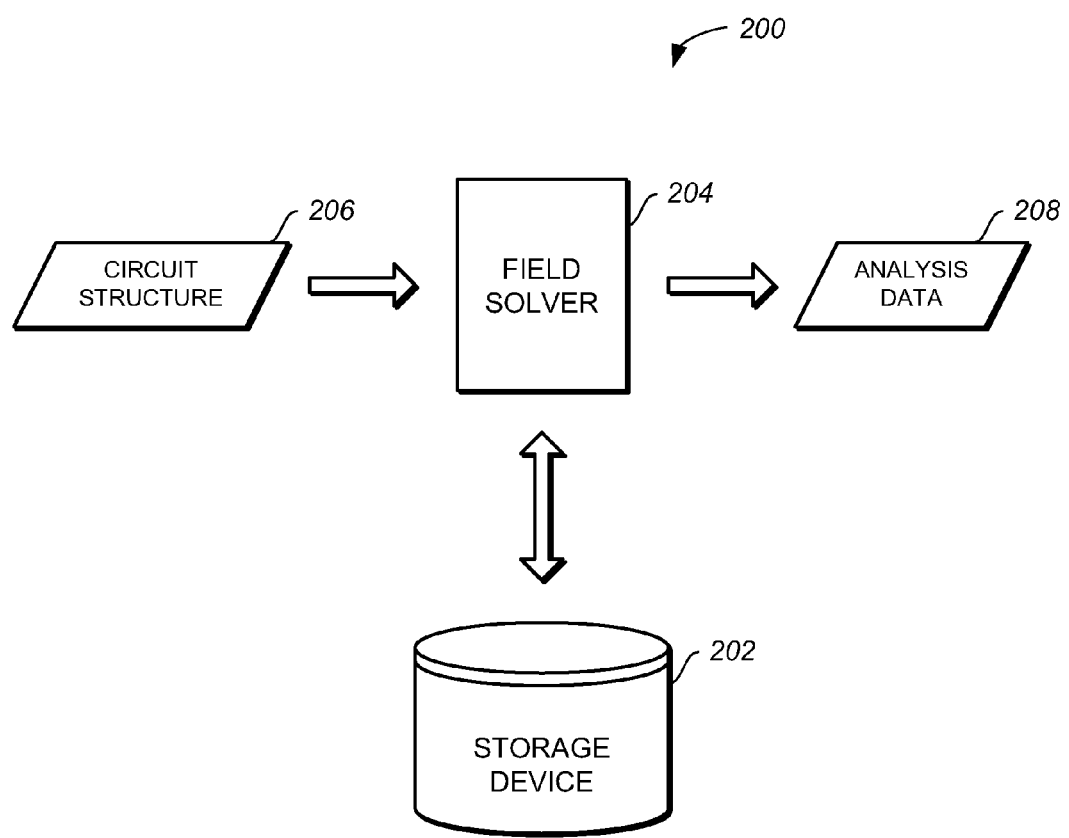
FIG. 2 illustrates a system for analyzing circuit structures for parasitic effects according to an implementation of the invention.

FIG. 2 illustrates a system 200 for analyzing circuit structures for parasitic effects according to an implementation of the invention. System 200 includes a storage device 202 (e.g., hard drive, memory, floppy disk, or the like) and a field solver 204 in communication with storage device 202. Storage device 202 stores information (e.g., topology, geometry, or the like) relating to a plurality of circuit structures previously analyzed for at least one parasitic effect as well as data from the at least one parasitic effect analysis previously performed on each of the plurality of circuit structures.

Field solver 204 receives a circuit structure 206 for analysis of one or more parasitic effects. In the implementation of FIG. 2, none of the plurality of circuit structures previously analyzed is identical to circuit structure 206. Field solver 204 compares circuit structure 206 to each of the plurality of circuit structures previously analyzed based on the information stored in storage device 202 relating to the plurality of circuit structures to determine whether any of the plurality of previously analyzed circuit structures is similar to circuit structure 206.

In one implementation, when circuit structure 206 is received for analysis by field solver 204, field solver 204 receives information relating to circuit structure 206, such as topology, geometry, or the like. As a result, comparison of circuit structure 206 to the plurality of previously analyzed circuit structures may include comparing the topology and geometry of circuit structure 206 to the topology and geometry of each of the plurality of previously analyzed circuit structures.

When one or more of the plurality of previously analyzed circuit structures are similar to circuit structure 206, field solver 204 uses some or all of the analysis data stored in storage device 202 for at least one of the one or more previously analyzed circuit structures that is similar to circuit structure 206 to analyze circuit structure 206 for the one or more parasitic effects. Field solver 204 then outputs analysis data 208 for circuit structure 206. In one implementation, analysis data 208 outputted by field solver 204 is stored in storage device 202 so that analysis data 208 can later be used to analyze other circuit structures.

Figure 3:
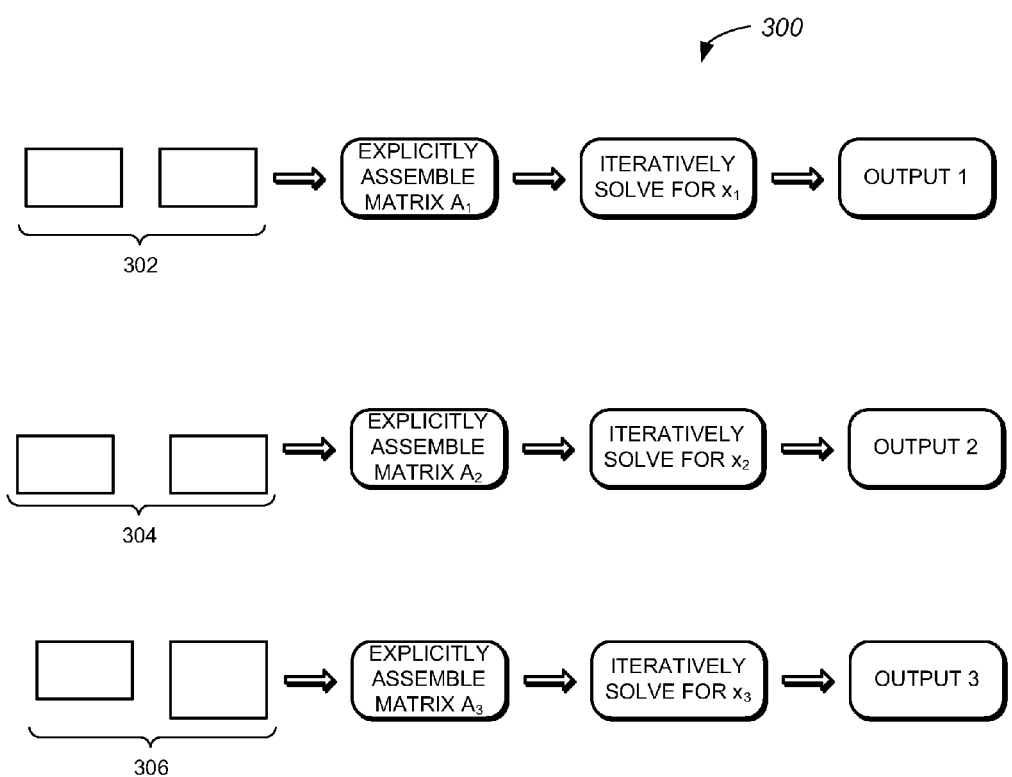
FIG. 3 shows an approach to calculating field solutions for circuit structures.

Calculating a field solution (e.g., solutions to some form of Maxwell's equations) for a circuit structure typically involves solving a system of linear equations $Ax=b$, where A is an N×N matrix, x is a column vector with N entries, and b is a column vector with N entries. Shown in FIG. 3 is one approach 300 to calculating field solutions for a plurality of circuit structures 302-306. With approach 300, each of circuit structures 302-306 are analyzed separately from scratch even though circuit structures 302-306 are similar to one another. In particular, the left element of each circuit structure 302-306 is of the same shape and size. Additionally, circuit structures 302 and 304 only differ in terms of spacing between the left and right elements. Further, circuit structures 302 and 306 only differ in terms of sizing of the right element.

Figure 4:
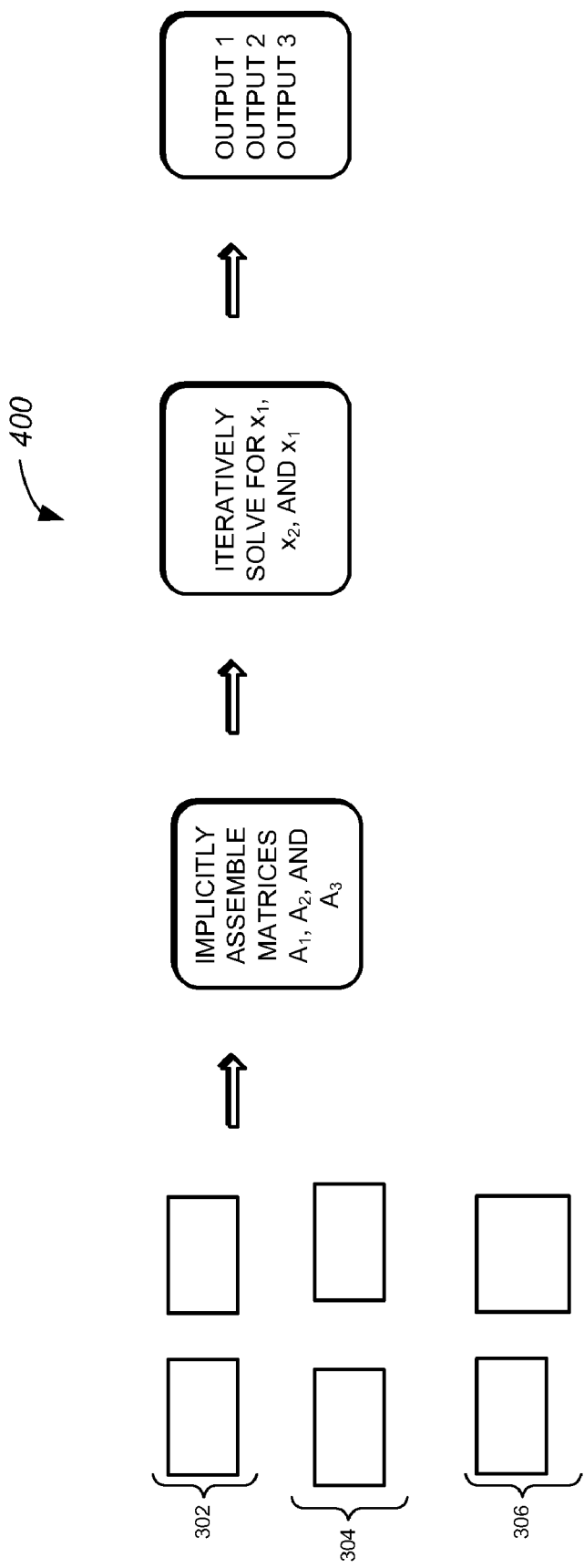
FIGS. 4-5 depict approaches to analyzing circuit structures according to implementations of the invention.

FIG. 4 depicts an approach 400 to analyzing circuit structures 302-306 in FIG. 3 according to an implementation of the invention. With procedure 400, all of circuit structures 302-306 are analyzed together instead of one at a time. Outputs for circuit structures 302-306 are also generated concurrently rather than separately. Further, some or all of the matrices for circuit structures 302-306 are implicitly assembled (e.g., assembled based on a previously assembled matrix). In other words, one or more blocks in a matrix are assembled from one or more blocks in a matrix previously assembled.

As a result, the costs associated with analyzing all of circuit structures 302-306 through approach 400 in FIG. 4 will be closer to that of the costs associated with analyzing a single circuit structure through approach 300. In addition, unlike sensitivity or perturbation analysis, approach 400 does not require small perturbation assumptions. Hence, the differences between circuit structures 302-306 can be larger. Further, results obtained through approach 400 are exact. There is no approximation error that has to be carefully examined as in sensitivity or perturbation analysis.

Figure 5:
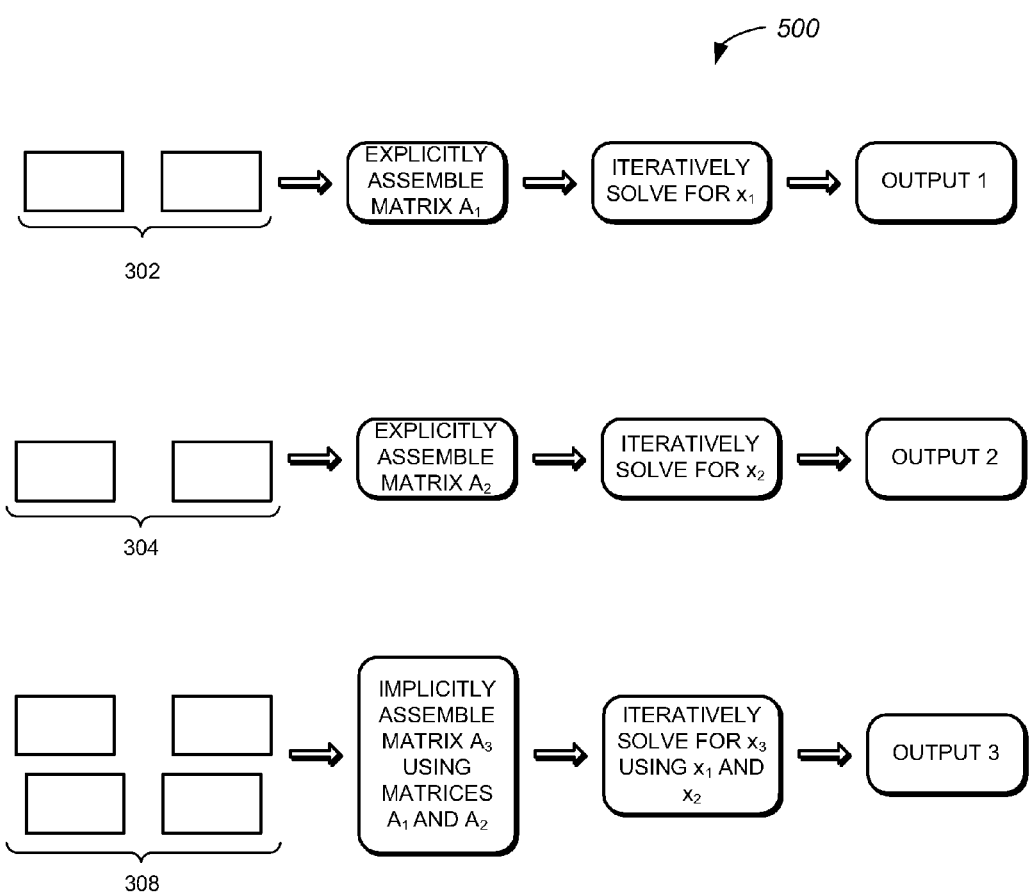

Illustrated in FIG. 5 is an approach 500 to analyzing circuit structures 302-304 and a new circuit structure 308 that is a composite of circuit structures 302-304 according to an implementation of the invention. With approach 500, a matrix is explicitly assembled and a vector is iteratively solved to produce an output for each of circuit structures 302-304. The matrices assembled for circuit structures 302-304 are then used to implicitly assemble a matrix for circuit structure 308. This can significantly reduce processor time.

Additionally, information collected to solve vectors for circuit structures 302-304 can be used to accelerate solving a vector for circuit structure 308 to produce an output. Thus, even though circuit structures 302-304 and 308 are analyzed separately, the costs and time associated with analyzing all of circuit structures 302-304 and 308 should still be less than if approach 300 was applied to separately analyze circuit structures 302-304 and 308. Further, sensitivity and perturbation analysis would not even be applicable in this situation because the change is way too large for sensitivity and perturbation analysis.

In the sections below, various examples and implementations for analyzing circuit structures for parasitic effects using data from previous parasitic effects analysis of other circuit structures are discussed.

Changing Circuit Structures

To help illustrate how a system of linear equations changes with changing circuit structures, suppose there are i circuit structures to be analyzed. Analysis of the i circuit structures can be characterized as calculating a solution to the following sequence of linear systems $$A^{(i)}x^{(i)}=b^{(i)} \quad (1)$$

In equation (1), the matrix $A^{(i)} \in \mathbb{R}^{N \times N}$ or the RHS (right-hand side) $b^{(i)} \in \mathbb{R}^{N}$ may change from one circuit structure to another. For instance, the RHS b may be changed when solving different columns of a multi-conductor problem. Changes to matrix A may result from, for instance, topologic or geometric transformations of a circuit structure.

FIGS. 6A-6D show sample geometric and topologic transformations of a circuit structure 600. Circuit structure 600a in FIG. 6A represents circuit structure 600 in its original geometry and topology with four conductors 602a-602d. FIGS. 6B-6D show different examples of geometric/topological transformations to circuit structure 600. Assume for FIGS. 6A-6D that each conductor 602 corresponds to diagonal blocks of the matrix A in equation (1) and the interaction between conductors 602 corresponds to off-diagonal blocks of matrix A.

Geometric/topologic transformations may change matrix A in different ways. For example, moving a conductor (e.g., moving of conductor 602b as shown in FIG. 6B) causes updates to matrix blocks associated with the moved conductor, excluding the diagonal block denoting the interaction of the conductor with itself. Enlarging a conductor (e.g., enlargement of conductor 602b as shown in FIG. 6C) causes updates to the corresponding matrix blocks, including the diagonal block. Adding a conductor (e.g., addition of a conductor 602e as shown in FIG. 6D) introduces new matrix blocks.

Suppose the matrices of an original circuit structure and an updated circuit structure are $A_0 \in \mathbb{R}^{N_0 \times N_0}$ and $A \in \mathbb{R}^{N \times N}$, respectively, where $N_0$ and N are not necessarily the same. Then, A can be written as $$A=f(A_0)+\Delta \quad (2)$$

In equation (2), $\Delta$ is the incremental update and $f(A_0)$ denotes the possible expansion or deflation of the matrix due to adding or removing of conductors, which is a simple modification to $A_0$. For example, when adding a new block to a system with an existing block, suppose $A_{22}$ denotes the interaction of the new block to itself, and $A_{12}$ and $A_{21}$ are the coupling between the new block and the existing block, then the matrix A can be written as $$A = \begin{bmatrix} A_0 & A_{12} \\ A_{21} & A_{22} \end{bmatrix} = \begin{bmatrix} A_0 & 0 \\ 0 & 0 \end{bmatrix} + \begin{bmatrix} 0 & A_{12} \\ A_{21} & A_{22} \end{bmatrix} \quad (3)$$

Thus, $f(A_0)$ and $\Delta$ can be defined as $$f(A_0) = \begin{bmatrix} A_0 & 0 \\ 0 & 0 \end{bmatrix}, \Delta = \begin{bmatrix} 0 & A_{12} \\ A_{21} & A_{22} \end{bmatrix} \quad (4)$$

With the above definition of the incremental update $\Delta$, problems with and without dimensional change can be treated similarly. Thus, for the sake of simplicity, it can be assumed that the size of $A_0$ is identical to the size of A. For problems without geometrical/topological change, $f(A_0)$ is simply given by $f(A_0)=A_0$.

For problems with geometrical/topological change, assuming the matrix-vector product $A_0v$ has previously been computed, computing the matrix-vector product Ax by using the previously computed matrix-vector product $A_0v$ and updating the matrix $A_0$ with the incremental update $\Delta$ should be faster than a regular computation of the matrix-vector product Ax.

To give an example, suppose only a small portion of the matrix $A_0$ will need to be updated to assemble the matrix A. If the off-diagonal blocks of the matrix $A_0$ are replaced by low-rank approximations and the incremental update $\Delta$ only affects the off-diagonal blocks, then $\Delta v$ can be calculated quickly. In this case, the size of the updated block is comparable to the unchanged blocks, thus it implies that it is not necessary to assume the update can only be a small portion of the whole matrix.

GMRES with Krylov Recycling

Generalized minimal residual method (often referred to as GMRES), which is a type of Krylov subspace method, is an iterative method that can be used to solve the system of linear equations Ax=b for x. To deal with the problems of incremental system updates resulting from topological/geometrical circuit structure variations, Krylov vector recycling can be used to reduce the number of GMRES iterations.

Assume that all matrices are already right-preconditioned, which means $A=\tilde{A}M^{-1}$, where $\tilde{A}$ is the actual matrix and M is the pre-conditioner such that the actual solution for the problem would be $\tilde{x}=M^{-1}x$, where x is the solution for Ax=b.

To solve equation $A_0x=b$ using GMRES, the residual is first calculated as $r_0=b-Ax_0$ with initial guess $x_0$. In iteration q, GMRES solves the least squares problem $$\min_{z \in \mathcal{K}_q(A,r_0)} \|r_0 - Az\| \quad (5)$$

by constructing an orthonormal basis in $\mathcal{K}_q(A_0,b)=\text{span}(b, A_0b, \ldots, A_0^{q-1}b)$ using Arnoldi's method, which leads to the following relation $$A_0V_q = V_{q+1}\overline{H}_q \quad (6)$$

where $V_q \in \mathbb{R}^{n \times q}$ and $\overline{H}_q \in \mathbb{R}^{(q+1) \times q}$.

For the updated Ax=b systems, in order to recycle the previous generated vectors $V_q$ and thus recycle the Krylov subspace, it is necessary to define a subspace projector $\mathcal{P}_{AV}$, which project any vector into subspace $$\mathcal{S}=\text{range}(P) \quad (7)$$

where $$P=AV_q \quad (8)$$

and then the null space projector $(I-\mathcal{P}_{AV})$ actually acts as the contrary role to remove the residual component out of the subspace $\mathcal{S}$, i.e., $\forall x$ it satisfies $P^T\mathcal{P}_{AV}x=0$.

This is comparable to solving the following least squares problem $$\min\|r_0-Py\| \quad (9)$$

and resulting in the residual for any input vector $r_0$.

One way to generate the projector is to perform QR decomposition $$AV_q=QR \quad (10)$$

Equation (9) can then be casted into $$\min\|r_0-QRy\|=\min\|Q^T r_0-Ry\| \quad (11)$$

Thus, the solution is given by $y=R^{-1}P^T r_0$, and the resulting residual is $$r=r_0-QRy=(I-QQ^T)r_0 \quad (12)$$

The projector can then be defined as $\mathcal{P}_{AV}=QQ^T$.

With the definition of the subspace projector, GMRES with Krylov recycling (KR-GMRES) can be described as follows:

1) Given an initial residual $r_0$ associated with a guess $x_0$, first remove its components out of subspace $\mathcal{S}$ by $$r_1=(I-\mathcal{P}_{AV})r_0 \quad (13)$$

2) Then perform GMRES iteration to generate Krylov subspace $\mathcal{K}=\mathcal{K}_m[(I-\mathcal{P}_{AV})A, r_1]$ using Arnoldi's process with $r_1/\|r_1\|$ as the starting vector and $(I-\mathcal{P}_{AV})A$ as the operator, and minimize the residual in union subspace $$\mathcal{M}=\mathcal{S}\cup\mathcal{K} \quad (14)$$

The use of $(I-\mathcal{P}_{AV})A$ as the operator assures that the new generated subspace $\mathcal{K}$ is orthogonal against subspace $\mathcal{S}$.

To analyze the computational complexity, before doing the real iteration when solving the updated system, q matrix-vector products may be performed to obtain $P=AV_q$. The multiplication can be performed in an incremental manner as $AV_q=(A_0+\Delta)V_q$, where $AV_q$ is already performed in the previous GMRES iteration in equation (6). The cost is determined by the number of recycled vectors times the number of non-zeros in $\Delta$. Suppose the non-zeros in $\Delta$ is k'N, then the cost for $\Delta V_q$ is (k'qN). The value of k' depends on the problem, but typically k'<<k, where kN is the number of non-zeros in A.

Another overhead cost is that to solve the least squares problem in equation (9), or to calculate the orthogonal projector $\mathcal{P}_{AV}$ with QR decomposition, $O(q^2N)$ time is needed. This time can be regarded as trivial if A is a numerically dense matrix, since a matrix-vector product needs $O(N^2)$ cost, and typically $q^2<<N$. With certain field solvers, however, the complexity of matrix-vector product is $O(kN)$, where k is usually in the hundreds. Hence, the recycling cost is equivalent to $q^2/k$ times of matrix-vector product. As q increases, the ratio of $q^2/k$ increases quadratically, which limits the number of recycled vectors.

GMRES with Modified Krylov Recycling

The quadratic increase of projection cost in GMRES with Krylov recycling is due to the QR decomposition, which is used to solve the least squares problem in equation (9). The drawback of using QR decomposition is that it cannot be performed incrementally. Hence, every time the matrix updates, a full QR decomposition should be done, even for a tiny modification. To overcome this, GMRES with modified Krylov recycling (MKR-GMRES) is used according an implementation of the invention. With MKR-GMRES, an incrementally updatable method is used to solve the least squares problem, which can be done using the pseudo inverse.

Pseudo Inverse

The pseudo inverse of a matrix P is defined as $$P^+=(P^T P)^{-1} P^T \quad (15)$$

and with the definition, the solution of the least squares problem in equation (9) can be simply written as $$y=P^+ r_0 \quad (16)$$

then the minimized residual is $r_1=(I-PP^T)r_0$, which means the orthogonal projector can be defined as $\mathcal{P}_{AV}=PP^+$.

The pseudo inverse exists for any matrix P with full column rank. But it is not so commonly used as QR decomposition for solving the least squares problem since, for general cases, the matrix $P^T P$ is not provably stable, and thus the inverse of it may encounter numerical problems.

In this case, however, $P=AV$, where V is orthonormal. Thus, it is provable that the condition number of $P^T P$ is strictly bounded using the following theorem.

Theorem 4.1: If $V_q$ is orthonormal, then with P defined in Equation (8), $\text{cond}(P^T P)\leq\text{cond}(A^T A)$ Proof:

$$\sigma_1(P) = \max_{\|y\|=1} \|AV_q y\| \leq \max_{\|x\|=1} \|Ax\| = \sigma_1(A) \quad (17)$$

$$\sigma_q(P) = \min_{\|y\|=1} \|AV_q y\| \geq \min_{\|x\|=1} \|Ax\| = \sigma_N(A) \quad (18)$$

$$\text{cond}(P^T P) = \frac{\sigma_1^2(P)}{\sigma_q^2(P)} \leq \frac{\sigma_1^2(A)}{\sigma_N^2(A)} = \text{cond}(A^T A) \quad (19)$$

Theorem 4.1 indicates that matrix $P^T P$ is never worse than $A^T A$ in terms of condition number, provided that $V_q$ is orthonormal. In integral equation based parasitic parameter extraction, the matrix A is generally well conditioned, plus in practice, the use of pre-conditioner further improves the condition, thus, the numerical problem here will not be too bad.

Incremental Update of Pseudo Inverse

From definition (15), to perform the incremental update of pseudo inverse, the first step is to update P, which can be done using $$P=A_0 V_q+\Delta V_q \quad (20)$$

With this assumption, the projector can be written as $$P^T P = (A_0 V_q + \Delta V_q)^T (A_0 V_q + \Delta V_q) \quad (21)$$
$$= P_0^T P_0 + P_0^T \Delta V_q + V_q^T \Delta P_0 + V_q^T \Delta V_q$$

where $P_0=A_0 V_q$. The first term in the equation (21) can be obtained using equation (6)

$$P_0^T P_0 = \bar{H}_q^T \bar{H}_q \quad (22)$$

Other terms in equation (21) can be calculated by exploiting the property of $\Delta$. Otherwise, if, for example, $P_0^T(\Delta V_q)$ is calculated directly, the cost is $q^2 N$ since $\Delta V_q$ is dense.

For different field solvers, $\Delta$ has different forms. In a hierarchical solver, the matrix A can be decomposed as $$A=J^T MJ \quad (23)$$

where $J\in\mathbb{R}^{R\times N}$ and $M\in\mathbb{R}^{R\times R}$ are both sparse matrix. J is a projection matrix with blocks being either 1 or 0. The update of system only occurs in interaction matrix M, thus $\Delta$ can be written as $$\Delta=J^T \Delta_M J \quad (24)$$

where $\Delta_M$ is a sparse matrix with non-zeros distributed in only some small number of columns and rows. Thus, the term $P_0^T \Delta V_q$ can be calculated as $$P_0^T \Delta V_q = (P_0^T J^T) \Delta_M J V_q \quad (25)$$

The term of $P_0^T J^T$ and $\Delta_M J V_q$ are calculated separately, where the cost $O(k'qN)$ for $\Delta_M J V_q$ is not additional one, since it is already done when updating P.

Suppose $\Delta_M$ has $N_{pi}$ (subscript 'pi' stands for 'pseudo leaf' to be discussed below) rows with non-zero blocks, the cost for $(P_0^T J^T) \Delta_M J V_q$ is $q^2 N_{pi}$. For incremental updating systems, $N_{pi} \ll N$. Thus, the cost is much less than $q^2 N$.

For the last term in equation (21), the calculation is similar, and the cost is provable to be $3/2 q^2 N_{pi}$. The whole cost to update pseudo inverse $P^+$ includes the update of P, which is k'qN and the inverse of $P^T P$, which can be done using Cholesky decomposition in $O(q^3)$ time. In this context, $q \ll N$, thus, the cost of inverse of $P^T P$ is omitted.

Krylov Recycling with Pseudo Inverse

Suppose $V_q$ is the Krylov vectors to be recycled, the first step to recycle the Krylov subspace is to minimize the residual in range $(V_q)$, resulting in the following least squares problem $$\min_{x \in range(v_q)} \|r_0 - Ax\| = \|r_0 - Py\| \quad (26)$$

which can be done by $y = P^+ r_0$, and thus the following residual and solution are obtained $$r_1 = (I - PP^+) r_0 \quad (27)$$

$$x_1 = x_0 + V_q P^+ r_0 \quad (28)$$

By right multiplying $P^T$ to both sides of equations (27) and (28), and using equation (15), it is verified that $r_1 \perp P$.

In the second step, an Arnoldi's procedure with $(I - PP^+)A$ as the operator and $v_1 = r_1 / \|r_1\|$ as the starting vector is performed to generate new orthonormal vectors $V_m$, which produces the following Arnoldi's relation $$(I - PP^+) A V_m = V_{m+1} \overline{H}_m \quad (29)$$

The null space projector $(I - PP^+)$ ensures that $V_{m+1}^T \perp P$. When $AV_q = P$ is placed on both sides of equation (29), the following equation results $$A [V_q \ V_m] = [P \ V_{m+1}] \begin{bmatrix} I & B \\ 0 & \overline{H}_m \end{bmatrix} \quad (30)$$

where $B = P^+ A V_m$. By defining $$V = [V_q \ V_m], \ W = [P \ V_{m+1}], \ G = \begin{bmatrix} I & B \\ 0 & \overline{H}_m \end{bmatrix},$$

equation (30) can be recast into $$AV = WG \quad (31)$$

At the end of each iteration, the following least squares problem is solved $$\min_{x \in range(V)} \|r_0 - Az\| = \min \|r_0 - WGy\| \quad (32)$$

which can be reduced to the $(m+q+1) \times (m+q)$ least squares problem $$Gy \approx (W^T W)^{-1} W^T r_1 \quad (33)$$

Since $W = [P \ V_{m+1}]$ and $V_{m+1} \perp P$, $$W^T W = \begin{bmatrix} P^T P & \\ & I \end{bmatrix} \quad (34)$$

Thus, with the definition of $P^+$, equation (33) can be cast into $$G y \approx \begin{bmatrix} P^+ \\ V_{m+1}^T \end{bmatrix} r_1 = \|r_1\| e_{q+1} \quad (35)$$

where $e_{q+1}$ is the q+1 column of a unit matrix. The last equal sign in equation (35) exploits the fact that $r_1 \perp P$ and thus $P^+ r_1 = 0$.

Below is an algorithm of the modified Krylov recycling method according to an implementation of the invention.

Figures 7, 8:
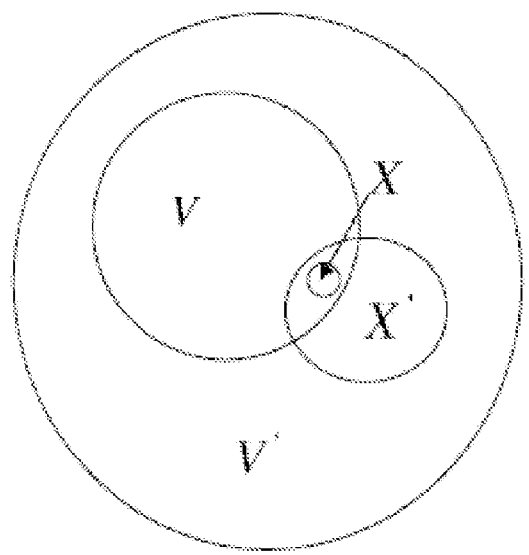
FIG. 7 shows a table comparing overall costs of utilizing traditional GMRES, KR-GMRES, and MKR-GMRES.
FIG. 8 is a Venn diagram depicting relationships between subspaces.

MKR-GMRES($A_{k+1}$, b, x, $V_q$, $P_q$)
  Calculate $P = A_{k+1} V_q$ and $P^+$ incrementally
  $x_1 = VP^+ b$, $r_1 = (I - PP^+) b$
  $v_1 = (I - PP^+) A v_m$, $B_{j,m} = P_j^T (A v_m)$
  $w = (I - PP^+) A v_m$, $B_{j,m} = P_j^T (A v_m)$
  while $\|r_m\| > $ tol do
    for i=1 to m do
      $H_{i,m} = w^T v_i$
      $w = w - H_{i,m} v_i$
    end for
    $H_{m+1,m} = \|w\|$, $v_{m+1} = w / \|w\|$ $$V_{q+m} = [V_q \ V_m], \ W_{q+m+1} = [P \ V_{m+1}] G_{q+m} = \begin{bmatrix} I & B \\ 0 & H \end{bmatrix}$$

solve least squares problem $Gy = \|r_1\| e_{q+1}$
    $r_{m+1} = r_1 - W G_{q+m} y$
  end while
  $x = x_0 + V_{q+m} y$
  Save $V_{q+m}$ and $P_{q+m} = [P \ AV_m]$ for the next system Depicted in FIG. 7 is a table 700 comparing the overall costs for traditional GMRES, Krylov Recycling GMRES (KR-GMRES), and Modified Krylov Recycling GMRES (MKR-GMRES). For traditional GMRES, the cost is solely due to iteration, which includes the cost for matrix-vector product and vector orthogonalization. For KR-GMRES and MKR-GMRES, the cost includes the projection time and iteration time. KR-GMRES and MKR-GMRES have the same number of iterations since the same subspace is recycled. The cost for each iteration in KR-GMRES and MKR-GMRES is also the same. The difference between KR-GMRES and MKR-GMRES lies in the projection time.

Enriching Recycled Subspace

The sections above relating to Krylov recycling assumed that the recycled subspace was limited to the Krylov subspace from previous GMRES iterations because 1) the Krylov subspace is a good approximation of the full space, since it contains the 'exact' solution for the previous system, and
2) the matrix-vector product $AV_q$ can be done incrementally It is possible to recycle some other subspaces that also satisfy the two criterions. One of the ways to do this is to deflate the given Krylov subspace to form a smaller subspace that captures the essence of the Krylov subspace. This can be done by choosing the harmonic Ritz vectors corresponding to the smallest harmonic Ritz values. The advantage of this is the reduction of the overhead cost. The number of iterations, however, will not be reduced since the deflated subspace is a subset of the Krylov subspace.

Partitioned-And-Shifted Krylov Recycling (PSKR)

Suppose a Krylov subspace is given as V, if all the unknowns can be clustered as groups, correspondingly, the vectors V can also be partitioned as $$V = \begin{bmatrix} V_1 \\ V_2 \\ \vdots \\ V_n \end{bmatrix} \quad (36)$$

The partition can be done spatially. For example, it can be in terms of the number of conductors, i.e., vectors $V_i$ corresponds to all unknowns in the i-th conductor.

A block diagonal matrix can be given as follows by shifting the blocks in matrix (36)

$$V' = \begin{bmatrix} V_1 & & & \\ & V_2 & & \\ & & \ddots & \\ & & & V_n \end{bmatrix} \quad (37)$$

It can be verified that range(V) ⊂ range(V'), and therefore, another candidate for subspace recycling could be span(V'). One advantage of recycling V' is that there is no additional cost to calculate P=AV' compared to calculating AV, while V' spans a bigger subspace that covers the subspace spanned by V. Thus, with the same cost of matrix-vector product, a larger subspace is obtained.

One drawback of recycling V' is that it increases the size of recycle subspace from q to nq, which increases projection cost. In addition, after each GMRES solution, the matrix $P'^T P$ is required to be calculated, which requires $n^2 q(q-q_0)N/2$ time, where $q_0$ and q are the numbers of Krylov vectors before and after the latest GMRES solution.

Another problem is that V' is no longer an orthonormal matrix, and it is not guaranteed to be linear independent. Consequently, the product matrix P' may also be linear dependent. In this case, the MKR-GMRES will fail.

To resolve the problem, a QR decomposition of V' can be performed using the Gram-Schmidt process, resulting in $$Q'R'=V' \quad (38)$$

during which if there is a linear dependent vector, the corresponding diagonal blocks of R' would be close to zero. Hence, linear dependent vectors can be found and removed. By doing this, the resulting V' is guaranteed to be full rank, and so is the product P. This can be done in an block-wise manner with $q(q-q_0)N$ time.

The QR decomposition in equation (38) can be done incrementally, unlike the QR decomposition discussed earlier, since V' is invariant with the update of A. Therefore, Gram-Schmidt only needs to be performed for newly added vectors.

To further improve the numerical stability, Q' can be chosen to replace V' as the recycled vectors. This requires the following calculation to be performed $$P'=PR'^{-1}=AQ' \quad (39)$$

which can be done incrementally in $O[nq(q-q_0)N]$ time, considering the block-wise structure of R'. In the cases that iteration cost dominates overall cost, it is still useful to recycle V'.

Partitioned-And-Shifted Solution Recycling (PSSR)

Another recycling option is to recycle solution vectors. Suppose that a certain number ($q_s$) of systems have previously been solved. Hence, there are $q_s$ solution vectors stored in matrix X. Similar to matrix (36), the solution can be partitioned in terms of clustered unknowns and shifted like matrix (37)

$$X = \begin{bmatrix} X_1 \\ X_2 \\ \vdots \\ X_n \end{bmatrix} \rightarrow X' = \begin{bmatrix} X_1 & & & \\ & X_2 & & \\ & & \ddots & \\ & & & X_n \end{bmatrix} \quad (40)$$

A subspace of $nq_s$ can then be obtained. Typically $q_s \ll q$. Since span(X) ⊂ span($V_q$), span(X') ⊂ span(V') can be verified.

The inclusion relations between subspaces spanned by $V_q$, V', X, and X' is illustrated in FIG. 8 as a Venn diagram 800. In Venn diagram 800, span(V') is the biggest subspace, $V_q$ and X' are both subsets of V', and the solution subspace is in the intersection of span($V_q$) and span(X'). All four subspaces cover the solutions. Hence, for a small matrix update, all of the subspaces can lead to the final solution without performing iterations.

Accelerating the System Setup

Previous sections discussed approaches to reduce the cost for solving a series of incrementally changing systems. However, solving the system is only one part of the total computation. The other is setting up the matrix in the linear system. The matrix is sometimes obtained through expensive potential integral (e.g., from Galerkin or Collocation schemes). As a result, the setup time may dominate the overall cost.

Sometimes, the dense diagonal blocks of the matrix are only calculated for the first system analyzed and only low-rank off-diagonal blocks are calculated when system changes are made. Thus, the average system setup time in terms of all systems may be reduced.

However, because the application of Krylov recycling reduces the system solving cost, the system setup time will play a more important role. In addition, for other kinds of incremental problems, such as problems with new blocks being added in an update, full-rank and dense blocks will still need to be calculated. Therefore, reducing setup time will further reduce overall cost.

Figure 9A:
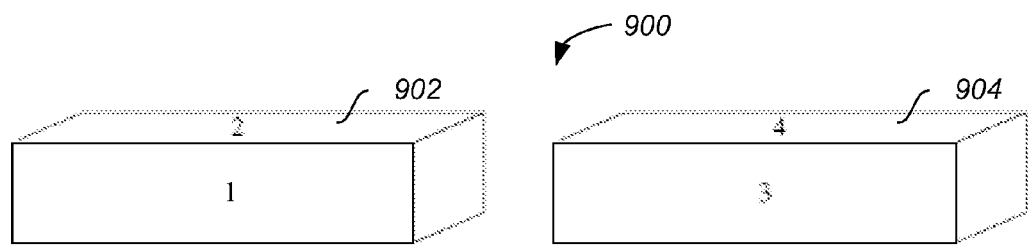
FIGS. 9A-9B illustrates an example of block reuse according to an implementation of the invention.
Figure 9B:
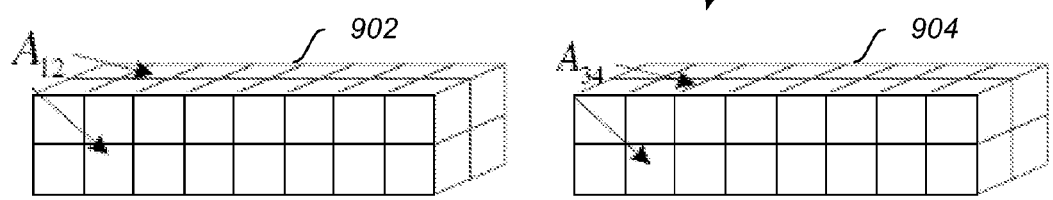

In typical circuit design, the problems are not arbitrarily structured. As a result, there are some common properties, which make it possible to reuse system setup 1) Most of interconnects are cubic and placed in Manhattan manner
2) Coordinates of the layout are subject to a minimum step size, which can be represented by an integer after being scaled
3) Interconnects in the same layer have the same thickness
4) Many interconnects have the same width and/or length Block Matrix Reuse Consider a structure 900 comprising two identical conductors 902 and 904 with a square cross section, as shown in FIGS. 9A-9B. Each face of conductors 902-904 is assigned a number as its label. After meshing, as shown in FIG. 9B, each pair of faces corresponds to a block matrix in the final linear system. For example, the pair (1,2) corresponds to matrix block $A_{12}$, and (1,1) corresponds to diagonal matrix block $A_{11}$, and so forth.

If the faces are meshed in the same way, and each meshed panel in these faces are labeled in the same order, then it is clear that $A_{11}=A_{22}=A_{33}=A_{44}$ and $A_{12}=A_{34}$, since they are equivalent to the same 'patterns'. Hence, the block matrix for each pattern needs to be calculated only once, and reused as many times as the number of duplication.

Below is an algorithm to determine whether a pair of root panels is equivalent to an existing pattern according to an implementation of the invention.

PatternMatch(Panel $P_{src}$, Panel $P_{eval}$)
  1) Rotate and move $P_{src}$ to a standard position, where a standard position means
     The center of the panel is on the origin
     The panel is in x-y plane, and all of the edges are alone x- or y-directions
     The first corner (defined in input) of the panel are in the $3^{rd}$ quadrant
  2) Perform the same transformation to $P_{eval}$. The position relations between the transformed $P_{src}$ and the transformed $P_{eval}$ is called a pattern.
  3) Search in the pattern library, if there exists the identical pattern, return true. Patterns are identical if
     The first corners of $P_{src}$ in both patterns are identical, and
     In both patterns, $P_{eval}$ are identical in shape, in the same position, or symmetrical in z-direction
  4) If the pattern does not exist in the library, insert the pattern into library and return false In the above algorithm, the first panel is transformed to a standard position through rotation and shift. The first panel is then compared to the position and orientation of the second panel. Since the order of panels may be critical, in one implementation, the corners of panels are labeled and when comparing, the panels should be matched corner by corner.

Based on the pattern matching algorithm above, set forth below is a block reuse algorithm according to an implementation of the invention.

Figure 10:
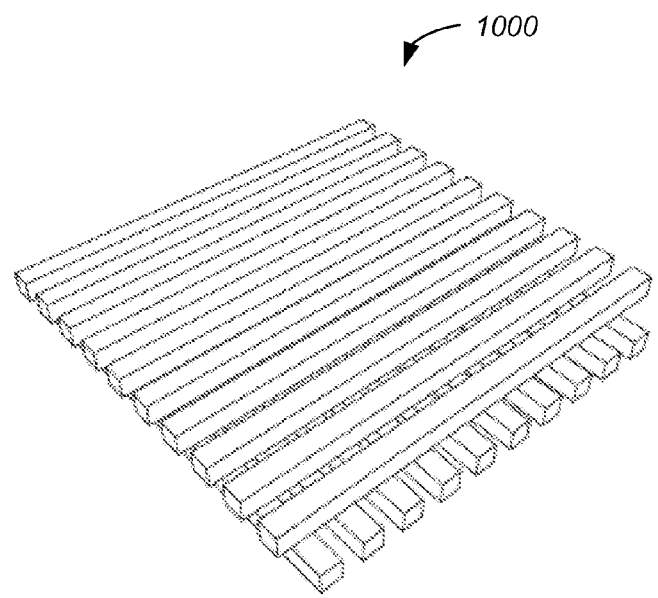
FIG. 10 depicts a sample bus structure.

SetupWithBlockReuse(PanelList panelList)
  For each pair of root panels $P_i$ and $P_j$ in panelist, do the following
    If PatternMatch($P_i$, $P_j$)=false, calculate block matrix $A_{ij}$
    Otherwise, link a pointer to the corresponding existing block matrix FIG. 10 depicts a sample 10×10 bus structure 1000. A table 1100 indicating statistics of repetitive patterns in bus structure 1000 is illustrated in FIG. 11. The left column of table 1100 is the top 5 patterns with most non-zeros when using hierarchical meshing. The right column is the corresponding repetition times. Each repetitive pattern needs to be calculated only once, and thus considerable time can be saved.

Hash Table

The block reuse method tries to find the redundancy before meshing. Another way to reduce the setup time is to find and make use of the redundancy after meshing, which can be done using a hash table. Referring back to FIG. 9B, the shapes of many leaf (e.g., meshed) panels are identical and as such, the self-coefficients are identical and need to be calculated only once. This can be done by building a library. Given a pair of panels, a library of previously analyzed panels could be searched using pattern recognition. If the pattern exists in the library, then no potential integral is needed, otherwise the coefficient is calculated, and size and positional information, as well as the corresponding coefficient are added to the library.

A hash table can be used to implement the library, where key-value pairs can be inserted into the hash table and the table can be looked up quickly using a hash code. The hash code is an integer number that serves as a digital "fingerprint". The design of hash code determines the efficiency of the table look-up.

In the hash table, the hash key is unique and the hash code can be shared by different hash keys. When multiple hash keys share a hash code, the situation is referred to as a conflict. If a conflict occurs, then additional comparison will need to be done to pick the desired panel. Thus, a conflict is supposed to be avoided. However, to a design a never-conflict hash code generally requires large amount of computation. Thus, the principal in designing a hash code is to have balance between the computational complexity of the key and the probability of conflict.

Figure 12:
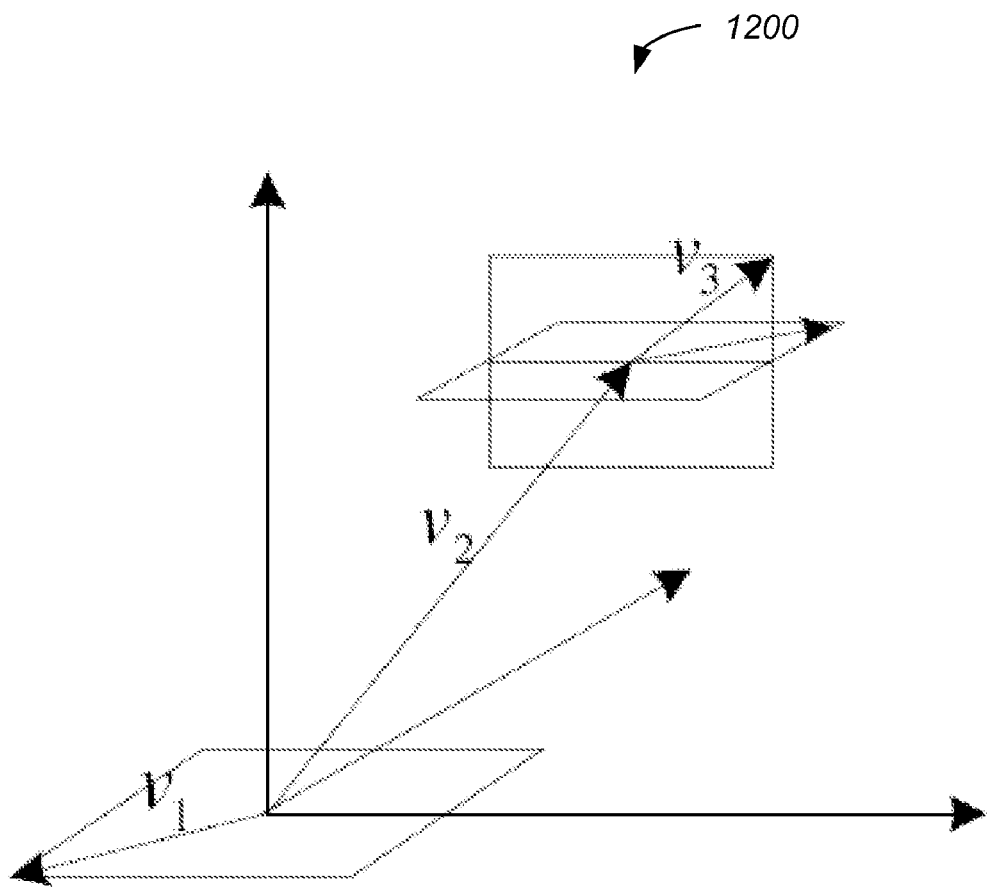
FIG. 12 illustrates an example of a hash key.

FIG. 12 shows an example of a hash key 1200 comprising three 3-D vectors, which used to uniquely describe a panel pair. In FIG. 12, it is supposed that one of the panels (panel #1) is already located in standard position. The first vector $v_1$ denotes the size (in x- and y-direction) of panel #1. The second vector $v_2$ denotes the relative coordinate of the centroid of panel #2. The third vector $v_3$ denotes the size and orientation of panel #2.

Due to symmetrical invariant of coefficient of potential, two patterns can be regarded as identical if the corresponding vectors $v_1$, $v_2$, and $v_3$ are identical in terms of their absolute value. The rotation of the first panel in order to transform it to standard position may have already been done in, for example, the block reuse stage. Hence, there is no additional cost, except for moving the panel to the origin. Since the pattern can be uniquely described by vectors $v_1$, $v_2$, and $v_3$, the 3-D vector can be encoded into an integer using any prime-number based methods.

In one implementation, a two-level hash table is used. The first level hash table uses $v_1$ as the key and hash($v_1$) as the hash code. The second level hash table uses $v_2$ and $v_3$ as the hash key, but only hash($v_2$) as the hash code.

For a certain panel pair, by looking up the first level hash table, panel #1 is matched, and a pointer of a second level hash table associated with given $v_1$ is found. The look-up of the first level hash table can be reused by appropriately arranging the order of potential coefficient calculation.

In the second level hash table, since only $v_2$ is used to generate the hash code, conflict will occur if different patterns have the same $v_2$, but different $v_3$. This is acceptable because the comparison cost is relatively small, and the probability for this kind of conflict is also small for realistic cases.

As seen in the discussions above, many types of data generated during parasitic effects analysis of circuit structures can be recycled and/or reused to improve the efficiency, cost, timing, and so forth associated with parasitic effects analysis of additional circuit structures. Specifically, recycling various types of vectors, reusing matrices, and hierarchically applying the recycling and/or reuse of data assist in reducing costs, increasing efficiency, expediting analysis, and so forth. In addition, the ideas herein may be applicable to other engineering problems involving linear partial differential equations, such as structural analysis, aerodynamic analysis, or the like.

The invention can take the form of an entirely hardware implementation, an entirely software implementation, or an implementation containing both hardware and software elements. In one aspect, the invention is implemented in software, which includes, but is not limited to, application software, firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include DVD, compact disk-read-only memory (CD-ROM), and compact disk-read/write (CD-R/W).

Figure 13:
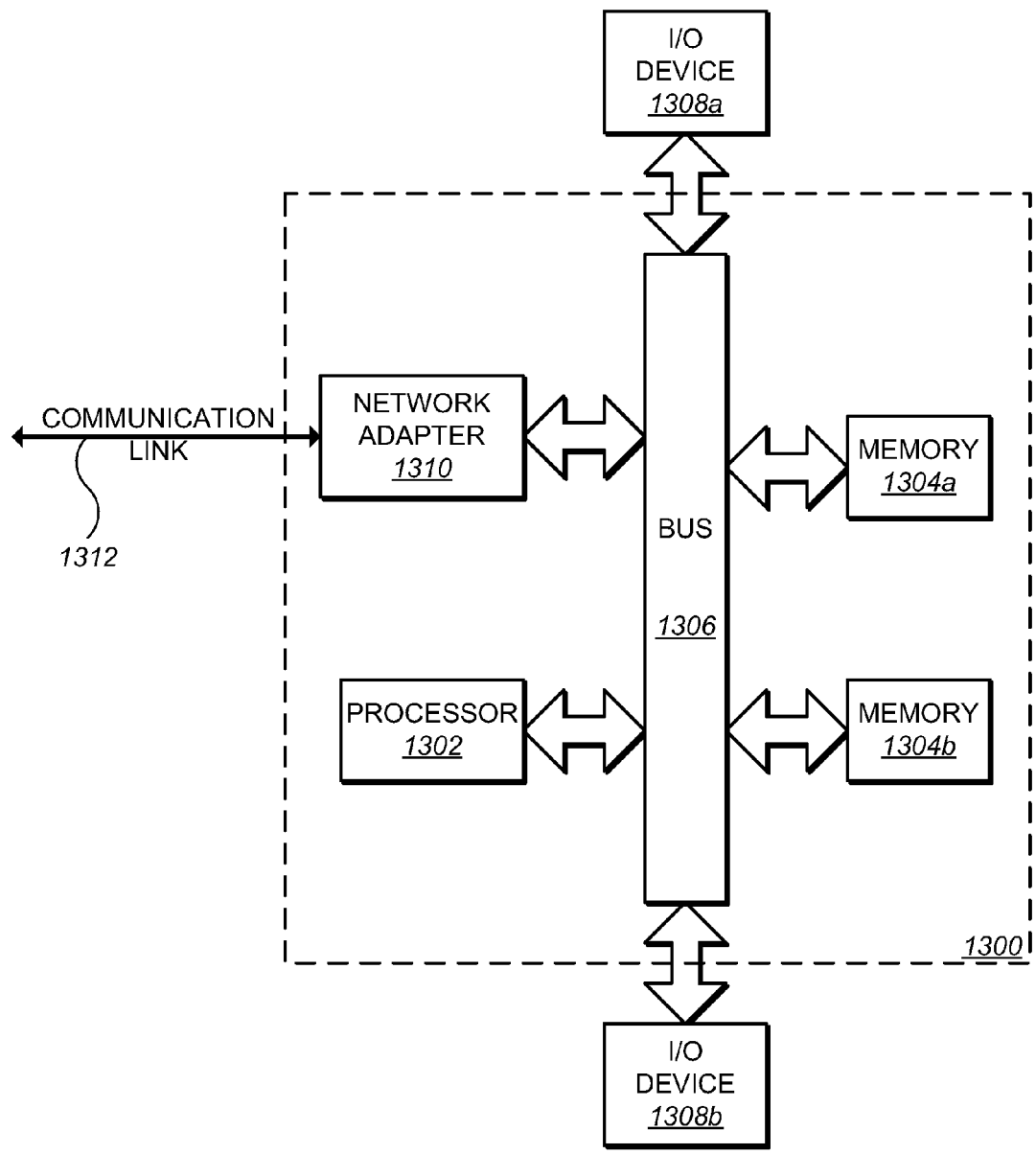
FIG. 13 is a block diagram of a data processing system with which implementations of the invention can be implemented.

FIG. 13 depicts a data processing system 1300 suitable for storing and/or executing program code. Data processing system 1300 includes a processor 1302 coupled to memory elements 1304a-b through a system bus 1306. In other implementations, data processing system 1300 may include more than one processor and each processor may be coupled directly or indirectly to one or more memory elements through a system bus.

Memory elements 1304a-b can include local memory employed during actual execution of the program code, bulk storage, and cache memories that provide temporary storage of at least some program code in order to reduce the number of times the code must be retrieved from bulk storage during execution. As shown, input/output or I/O devices 1308a-b (including, but not limited to, keyboards, displays, pointing devices, etc.) are coupled to data processing system 1300. I/O devices 1308a-b may be coupled to data processing system 1300 directly or indirectly through intervening I/O controllers (not shown).

In the implementation, a network adapter 1310 is coupled to data processing system 1300 to enable data processing system 1300 to become coupled to other data processing systems or remote printers or storage devices through communication link 1312. Communication link 1312 can be a private or public network. Modems, cable modems, and Ethernet cards are just a few of the currently available types of network adapters.

While various implementations for analyzing circuit structures for parasitic effects have been described, the technical scope of the present invention is not limited thereto. For example, the present invention is described in terms of particular systems having certain components and particular methods having certain steps in a certain order. One of ordinary skill in the art, however, will readily recognize that the methods described herein can, for instance, include additional steps and/or be in a different order, and that the systems described herein can, for instance, include additional or substitute components. Hence, various modifications or improvements can be added to the above implementations and those modifications or improvements fall within the technical scope of the present invention.

The invention claimed is:

1. A method for analyzing circuit structures for parasitic effects, the method comprising:
   receiving a first circuit structure for analysis of a parasitic effect;
   comparing the first circuit structure to a second circuit structure not identical to the first circuit structure to determine whether the second circuit structure is similar to the first circuit structure; and
   responsive to the second circuit structure being similar to the first circuit structure, analyzing by a processor the first circuit structure for the parasitic effect using data from a previous analysis of the second circuit structure for the parasitic effect, wherein the analyzing includes performing calculations using a field solver using the data from the previous analysis.

2. The method of claim 1, wherein analyzing the first circuit structure for the parasitic effect comprises:
   analyzing the first circuit structure for the parasitic effect using a vector generated during the previous analysis of the second circuit structure for the parasitic effect.

3. The method of claim 2, wherein the vector generated during the previous analysis of the second circuit structure is one of a Krylov vector, a solution vector, an Eigen vector, and a principal component vector.

4. The method of claim 1, wherein analyzing the first circuit structure for the parasitic effect comprises:
   analyzing the first circuit structure for the parasitic effect using a matrix assembled during the previous analysis of the second circuit structure for the parasitic effect.

5. The method of claim 1, wherein analyzing the first circuit structure for the parasitic effect comprises:
   analyzing the first circuit structure for the parasitic effect using a matrix vector product computed during the previous analysis of the second circuit structure for the parasitic effect.

6. The method of claim 1, wherein the second circuit structure is similar to the first circuit structure when one of the first circuit structure and the second circuit structure is a sub-structure of the other.

7. The method of claim 1, wherein receiving the first structure for analysis of the parasitic effect comprises receiving a description of a topology and a geometry of the first circuit structure to be analyzed for the parasitic effect, and
   wherein comparing the first circuit structure to the second circuit structure comprises comparing the topology and the geometry of the first circuit structure to a topology and a geometry of the second circuit structure to determine whether the second circuit structure is similar to the first circuit structure.

8. The method of claim 7, wherein the second circuit structure is similar to the first circuit structure in response to the first circuit structure and the second circuit structure sharing an identical sub-structure.

9. The method of claim 1, wherein the parasitic effect is one of stress, thermal, simulation, diffraction, and electromagnetic effect.

10. A computer program product for a circuit design process, including a non-transitory computer-readable medium storing executable program code, the computer program product comprising code, which when executed, performs the method of claim 1.

11. A system for analyzing circuit structures for parasitic effects, the system comprising:
   a data storage device; and
   a field solver in communication with the data storage device, the field solver:
      receiving a first circuit structure for analysis of a parasitic effect,
      comparing the first circuit structure to a second circuit structure not identical to the first circuit structure to determine whether the second circuit structure is similar to the first circuit structure, and responsive to the second circuit structure being similar to the first circuit structure, analyzing the first circuit structure for the parasitic effect using data from a previous analysis of the second circuit structure for the parasitic effect that is stored in the storage device, wherein the analyzing includes performing calculations with the field solver using the data from the previous analysis.

12. The system of claim 11, wherein the field solver analyzes the first circuit structure for the parasitic effect by:

analyzing the first circuit structure for the parasitic effect using a vector generated during the previous analysis of the second circuit structure for the parasitic effect.

13. The system of claim 12, wherein the vector generated during the previous analysis of the second circuit structure is one of a Krylov vector, a solution vector, an Eigen vector, and a principal component vector.

14. The system of claim 11, wherein the field solver analyzes the first circuit structure for the parasitic effect by:

analyzing the first circuit structure for the parasitic effect using a matrix assembled during the previous analysis of the second circuit structure for the parasitic effect.

15. The system of claim 11, wherein the field solver analyzes the first circuit structure for the parasitic effect by:

analyzing the first circuit structure for the parasitic effect using a matrix vector product computed during the previous analysis of the second circuit structure for the parasitic effect.

16. The system of claim 11, wherein the second circuit structure is similar to the first circuit structure when one of the first circuit structure and the second circuit structure is a sub-structure of the other.

17. The system of claim 11, wherein the field solver receives the first structure for analysis of the parasitic effect by:

receiving a description of a topology and a geometry of the first circuit structure to be analyzed for the parasitic effect, and wherein the field solver compares the first circuit structure to the second circuit structure by:

comparing the topology and the geometry of the first circuit structure to a topology and a geometry of the second circuit structure to determine whether the second circuit structure is similar to the first circuit structure.

18. The system of claim 17, wherein the second circuit structure is similar to the first circuit structure in response to the first circuit structure and the second circuit structure sharing a sub-structure.

19. The system of claim 11, wherein the field solver further stores data generated from the analysis of the first circuit structure in the storage device.

20. The system of claim 11, wherein the parasitic effect is one of stress, thermal, simulation, diffraction, and electromagnetic effect.

* * * * *